United States Patent

Thomson

[15] 3,704,422

[45] Nov. 28, 1972

[54] FREQUENCY LOCK-IN PRESET TUNING SYSTEM

[72] Inventor: Roger B. Thomson, Columbus, Ind.

[73] Assignee: Arvin Industries, Inc., Columbus, Ind.

[22] Filed: Dec. 18, 1970

[21] Appl. No.: 99,396

[52] U.S. Cl. ....................325/422, 325/469, 325/470

[51] Int. Cl. ....................H04b 1/16

[58] Field of Search......325/418, 422, 433, 453, 459, 325/469, 470

[56] References Cited

UNITED STATES PATENTS

| | | | |
|---|---|---|---|
| 3,233,179 | 2/1966 | Klettke | 325/469 |
| 3,588,706 | 6/1971 | Sakai et al. | 325/418 X |
| 3,201,696 | 8/1965 | Sharp | 325/469 X |
| 3,440,544 | 4/1969 | Pampel | 325/422 |

*Primary Examiner*—Robert L. Griffin
*Assistant Examiner*—Richard K. Eckert, Jr.
*Attorney*—Trask, Jenkins & Hanley

[57] ABSTRACT

A preset tuning system has a search tuning system with varactor tuning means coupled to its output. Switch means, when closed, connects the input of the search tuning means to a voltage source so as to apply to the input a voltage sufficient to hold the search tuning circuit in a state of equilibrium. The switch means, when closed, also connects a control voltage source to the varactor tuning means and to the output of the search tuning circuit which serves to coincidentally control the voltage on the output of the search tuning circuit and the varactor tuning means while the switch means is closed. When the switch means is then opened, the search tuning circuit will immediately lock on the center of the incoming signal, whereby the voltage on its output is maintained.

5 Claims, 2 Drawing Figures

INVENTOR
ROGER B THOMSON
BY
Frank, Jenkins & Hanley
ATTORNEYS

INVENTOR
ROGER B. THOMSON
BY
Frank, Jenkins & Hanley
ATTORNEYS

FREQUENCY LOCK-IN PRESET TUNING SYSTEM

BACKGROUND OF THE INVENTION

It is often desirable to provide some means of preset tuning for radio frequency (RF) receivers, such as radio, television, communication receivers, etc. A common example of preset tuning is found in the push button tuning system used in many automobile radios.

Preset tuning systems for RF receivers sometimes utilize variable capacitance diodes (varactors) for tuning. When reverse biased, the capacitance of such diodes varies with the voltage applied. The tuning capacitance may therefore be changed by adjusting the reverse bias voltage on the varactors. Such tuning systems have normally utilized some form of direct current voltage dividers, such as potentiometers, connected to the varactors by a switch. When the output from one such voltage divider is connected through a direct current path to the varactors, the receiver may be tuned to one desired frequency or channel. That voltage divider normally remains connected to the varactors until a change in the frequency or channel is desired. That first voltage divider is then disconnected and a second voltage divider which is set to the desired new frequency or channel is connected to the varactors.

Systems of this type commonly suffer varying degrees of frequency instability in that the receiver will drift from the desired center frequency. The shifting of voltage levels, changes in component parameters due to temperature variations, component aging, changes in humidity, etc., may cause or contribute to this instability. Although various means may be used to control instability, such as voltage regulators, temperature-compensating capacitors, and thermistors, these control means are costly and effective only in reducing the degree of frequency drift. They do not eliminate it.

SUMMARY OF THE INVENTION

This invention utilizes a preset circuit and a signal-seeking system to provide a preset tuning system which will automatically lock on the center of the desired frequency or channel. The aforementioned instability problems and the resulting frequency drift are eliminated.

A plurality of switch means which are normally in an open position are arranged so that when any one of them is closed, the output of a voltage source is applied to the input of the search tuning circuit and the output of an associated, control voltage source is applied to the output of the search tuning circuit. A varactor tuning circuit is also connected to the output of the search tuning circuit.

The voltage applied to the input of the search tuning circuit is sufficient to hold that circuit in a state of equilibrium. While the search tuning circuit is thus inhibited, the varactor tuning circuit may be tuned by varying the voltage applied to the output of the search tuning circuit. When the desired signal is received the switch means may be opened and the search tuning circuit will immediately lock on the center of that signal. Subsequent momentary closing of any of the switch means will cause the receiver to be immediately tuned to the preset frequency or channel.

The detailed description of an embodiment of this invention describes the preset circuit in conjunction with a signal-seeking system for an AM/FM radio. The preset circuit may also be used with similar signal-seeking systems for television or other RF receivers.

BRIEF DESCRIPTION OF THE DRAWING

The invention is illustrated in the drawing in which.

DETAILED DESCRIPTION OF THE PREFERRED EMBODIMENT

Figure 1:
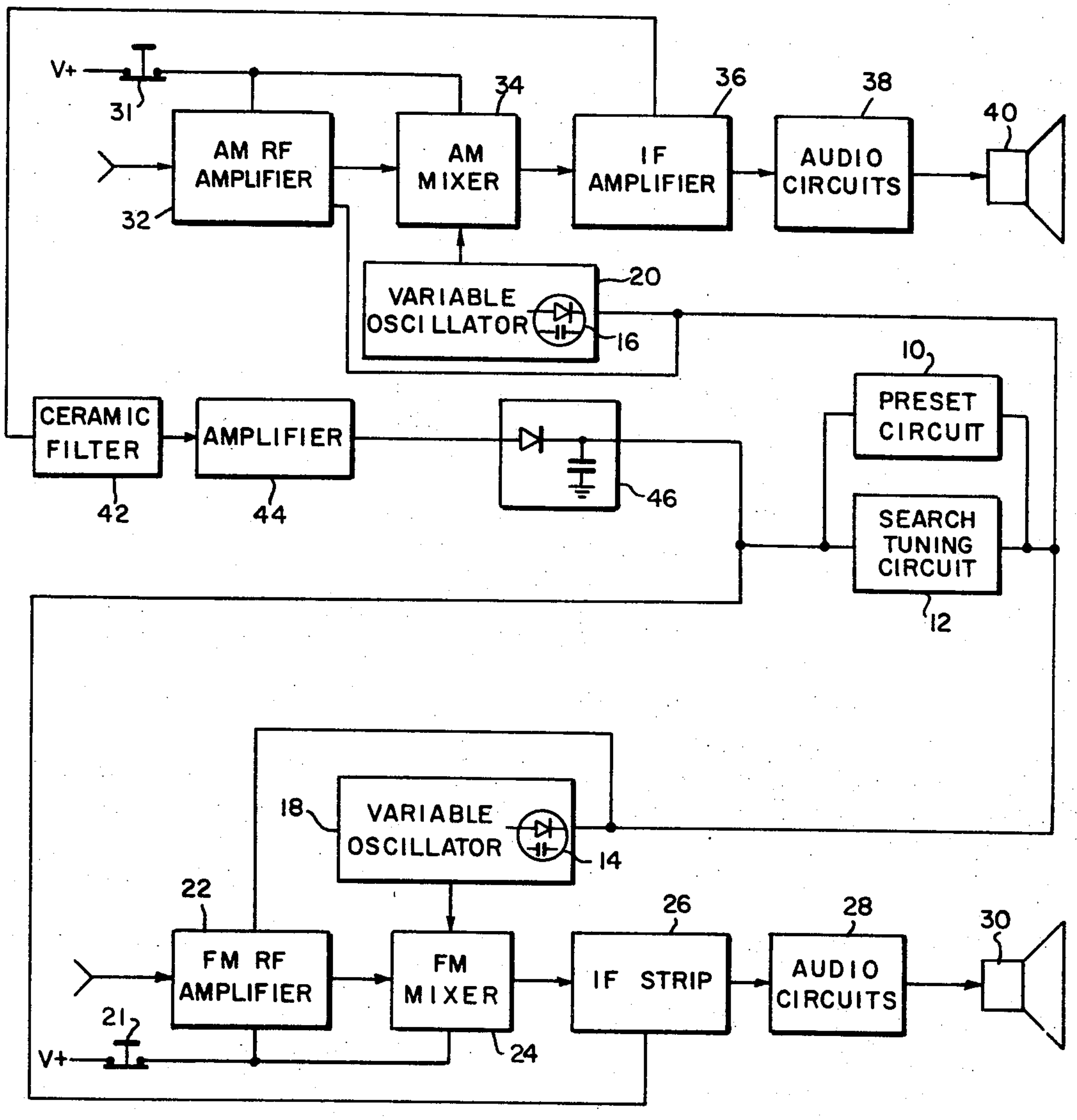
FIG. 1 is a block diagram of a circuit embodying this invention and showing AM and FM receiver circuitry connected thereto.

As illustrated in FIG. 1, the preset circuit of this invention, shown generally as 10, is coupled to a search tuning circuit 12 which in turn is coupled to varactor tuning means 14 and 16 within variable oscillators 18 and 20. Variable oscillator 18 is in the FM portion of the receiver and variable oscillator 20 is in the AM portion.

The FM portion of the receiver or radio typically comprises an FM/RF amplifier 22 coupled to a mixer 24 which has a second input from the variable oscillator 18. The amplifier 22 and mixer 24 are both furnished with DC supply voltage through the normally closed search release button 21. The output of the mixer 24 is coupled to an IF amplifier 26 which has one output coupled through a combination of audio circuits 28 to a speaker 30 and another to the input of the search tuning circuit. The latter connection is the feedback line for the Automatic Frequency Control as will be hereinafter described. RF energy is supplied to the amplifier 22 which has its output signal mixed by the circuit 24 with the signal from the variable oscillator 18 to produce an IF signal for each station which is picked up by the radio. As the frequency of the variable oscillator 18 is increased from its lowest value it combines with the carrier frequency of the lowest frequency station to produce the IF signal which is modulated with an information signal from the lowest frequency station. Accordingly, as the variable oscillator frequency is increased to its maximum value, it causes the mixer 24 to reproduce the IF frequency at each succeeding station.

The AM portion of the receiver typically comprises an RF amplifier 32 having an output to a mixer 34. DC supply voltage is supplied to this amplifier 32 and mixer 34 through a normally closed search release button 31. The mixer 34 receives another input from the variable oscillator 20. The output of the mixer is coupled through an IF amplifier 36 in various audio circuits 38 to a speaker 40. An output from the IF amplifier 36 is coupled through a narrow-band filter 42 tuned to the IF frequency of the AM system, and the output of the filter is coupled through an amplifier 44 and a rectifier 46 to the input of the search turning circuit 12.

Figure 2:
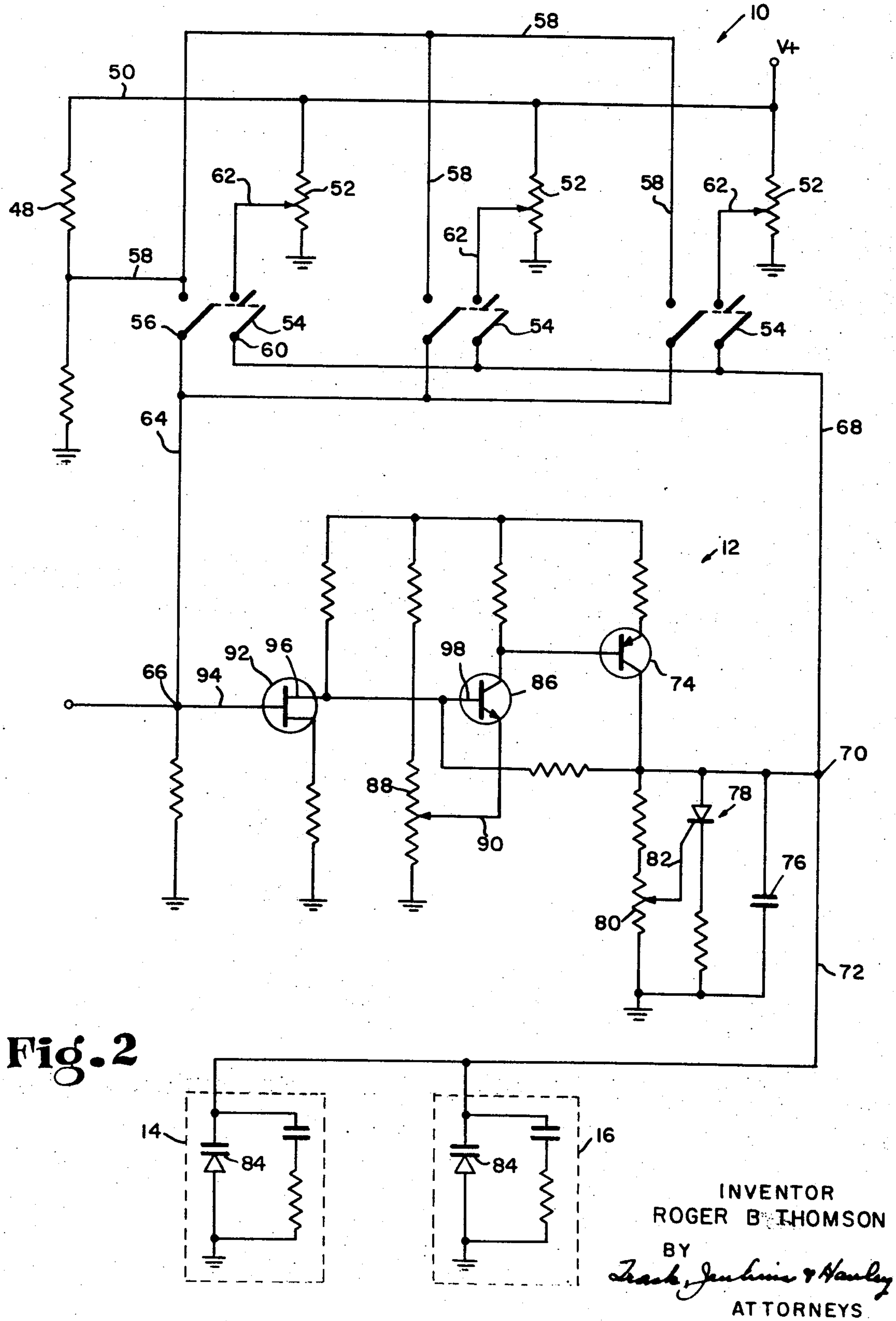
FIG. 2 is a circuit diagram showing the preset circuit, the search tuning circuit and the tuning means.

As illustrated in FIG. 2, the preset circuit 10 has a second voltage source, such as a voltage divider 48 connected between the positive DC voltage lead 50 and ground. The resistances in the voltage divider 48 are preferably of a fixed value. A plurality of control or first voltage sources, such as potentiometers 52, are also connected between lead 50 and ground. A separate two-pole, single-throw, momentary contact switch 54 is associated with each of the potentiometers 52. Each of the switches 54 is normally in the open position. When any of switches 54 is temporarily closed, one pole 56 of the switch is connected to the lead 58 from voltage divider thereby providing a predetermined voltage at the pole 56 of the closed switch. The other pole 60 of each switch 54 is connected to the wiper arm 62 of its associated potentiometer 52. Thus by adjusting a wiper arm 62, an adjustable voltage may be applied to the pole 60 of a switch 54 when that switch is closed.

The switch pole 56 is connected by a lead 64 to the input 66 of search tuning circuit 12. The switch pole 60 which leads from the wiper arm 62 of its associated potentiometer is connected by a lead 68 to the output 70 of search tuning circuit 12. A lead 72 connects varactor tuning means 14 and 16 with output 70. Thus upon closing any of the switches 54, the voltage from voltage divider 48 will be applied to input 66, and the voltage from the voltage source or potentiometer 52 which is associated with the closed switch will be applied to output lead 70. Output lead 70 is, of course, continually connected to the varactor tuning means 14 and 16. Tuning means 14 and 16 are the variable tuned circuits for determining the frequency at which the variable oscillators 18 and 20 oscillate. The search tuning circuit 12 comprises a ramp generator and locking circuit.

When all of the switches 54 are in their normally open positions, the preset circuit 10 is not connected to the search tuning circuit 12 or the tuning means 14 and 16. The receiver thus operates in a signal-seeking mode utilizing the ramp generator and locking circuit to lock on the center of an incoming signal. The ramp generator generates a ramp of voltage which is applied to the varactors which causes the tuning circuits to sweep through the RF band from low to high. When the sweep reaches the high end of the band, the ramp discharges to its starting point and repeats the sweep.

When a signal is received, the locking circuit senses the presence of an IF and stops the ramp on the center of the incoming signal. Depressing one of the search release buttons 21 and 31 eliminates the DC supply voltage to the input circuit of the receiver, thus eliminating the locking signal, and the ramp resumes its operation. As long as the search release button remains depressed, the ramp will continue to cycle since no locking signal can pass through the tuner. However, as soon as the button is released, DC supply voltage is again applied to the tuner and the ramp will lock on the next signal received.

In the absence of an incoming RF signal, transistor 74 charges capacitor 76, producing an almost linearly increasing voltage across capacitor 76. When this voltage builds to a desired value, such as approximately 11.5 volts, a silicon controlled rectifier (SCR) 78, which is connected in parallel with capacitor 76, turns on and instantaneously discharges this voltage to less than 1 volt. SCR 78 cannot continue to conduct at this low voltage and thus shuts off. Transistor 74 again begins charging capacitor 76 up to the firing point. The exact firing voltage for SCR 78 is set by adjustment of resistor 80 which controls the voltage to the gate 82. One such charging and discharging cycle may, for example, require approximately eight seconds.

The anode of SCR 78 is connected to the cathodes of the appropriate varactor diodes 84. The ramp of voltage produced across capacitor 76 thus causes the tuning to sweep from the low to the high frequencies in the RF band. Transistor 86 controls transistor 74 and thus controls the charging rate for capacitor 76. In the quiescent condition (no incoming RF signal), resistor 88 may be adjusted so that the charging time is approximately eight seconds. As the slider 90 on resistor 88 is set nearer to ground, transistor 86 draws more current, and the voltage drops at the collector of transistor 86 and base of transistor 74. This causes transistor 74 to draw increasing current, thus charging capacitor 76 at a faster rate and reducing the sweep cycle time. Conversely, adjusting the slider 90 away from ground increases the cycle time.

A field effect transistor (FET) 92 operates as a high impedance DC amplifier controlling transistor 86 and also transistor 74. FET 92, transistor 86 and transistor 74 are DC-coupled together and are used for amplification of DC voltage which controls the charging rate of capacitor 76.

The FM locking operation is as follows. The input to gate 94 of FET 92 is fed from the AFC line and of course from the rectifier 46 in the AM circuitry. When the local oscillator is below the desired frequency, a negative voltage is generated on this AFC line. When it is above the desired frequency, a positive voltage is generated. And when it is correct, the AFC line voltage is zero.

By way of example, assume that the desired RF signal is 100 MHz and the oscillator is sweeping from low to high. As the local oscillator approaches 110.7 MHz (100.0 MHz RF + 10.7 MHz IF), it is below the desired frequency for correct tuning. When the oscillator is low in frequency, a negative voltage is generated on the AFC line. Since this line is DC-coupled to the gate 94 the current in FET 92 decreases. This raises the voltage on the drain electrode 96 of the FET 92 and the base 98 of transistor 86. In turn, transistor 86 draws increased current and causes transistor 74 to increase the charging current to capacitor 76. This then has the effect of accelerating the sweep toward the center of the desired RF signal — 100 MHz in this example.

At the center of the desired signal, zero voltage is present on the AFC line. Again following the DC path through the locking circuit, the net effect is that the charging current applied to capacitor 76 by transistor 74 is reduced and sweep speed slows. At a point just above center frequency, a positive voltage is generated on the AFC line that permits only sufficient charging current to offset the loss in charge due to leakage in capacitor 76 and the associated circuit. In effect, the charging ramp is stopped and maintains a position of equilibrium very near the center of the RF signal being received. The fact that the equilibrium point is slightly off center has no detrimental effect and for all practical purposes the set is tuned to the center frequency.

Depressing the search release button 21 eliminates DC supply voltage to the RF amplifier and mixer. With no signal present, the AFC voltage goes to zero and the ramp generator resumes its charging.

Operation of the locking circuit is slightly different on AM since there is never a negative voltage generated. The sweep is therefore not accelerated, but instead is decelerated, when approaching the center of the RF signal.

The 455 KHz IF is taken from the last IF amplifier 36 and fed to a ceramic filter 42. This filter reduces the bandwidth from approximately 8 KHz to 3 KHz. Thus the locking signal is much sharper than the IF bandwidth and assures that the stopping point is sufficiently near the center of the IF to eliminate any distortion.

The output of the ceramic filter 42 is fed to amplifier 44 which acts as an additional stage of gain for the 455 KHz locking signal. This signal is then rectified by rectifier 46 which applies a positive DC voltage at the gate 94 of FET 92.

When the rectified locking signal reaches a sufficient amplitude, the charging current to capacitor 76 reaches a state of equilibrium. If the frequency of the local oscillator drifts lower, the rectified locking signal voltage reduces, and causes the capacitor 76 to be charged, thus returning the local oscillator to the correct frequency. If the oscillator drifts higher, the DC voltage increases and shuts off transistor 74, thus allowing the voltage on capacitor 76 to leak off, again returning the local oscillator to the correct frequency.

The equilibrium condition depends on the voltage ramp stopping on the side of the ceramic filter response curve where the output voltage of the ceramic filter increases with a corresponding increase in frequency of oscillation. If it stopped in the center there would be no way of obtaining an increasing voltage as the local oscillator drifted higher. It is necessary, therefore, that the stopping point on the side of the ceramic filter response coincide as nearly as possible with the center of the IF response. To accomplish this, the IF is tuned approximately 3 KHz below the fixed tuned center frequency of the ceramic filter 42. When the search release button 31 is depressed, the RF amplifier and mixer DC supply voltage is eliminated (no IF signal is present) and the ramp resumes charging the capacitor 76.

When one of the switches 54 is closed, its pole 56 connects the output of voltage divider 48 with the input 66 of search tuning circuit 12, which is the gate 94 of FET 92. This output voltage is to be of a value sufficient to hold the ramp generator in a state of equilibrium. Thus while any of switches 54 is closed the search tuning circuit is inhibited. In other words, while a switch is closed the search tuning circuit does not sweep and is not controlled by an incoming signal. Simultaneously upon the closing of a switch, the pole 60 connects the output of the associated potentiometer 52 to the output 70 of circuit 12, which is the output of the ramp generator.

With a switch 54 closed the receiver may be tuned by adjusting the output voltage of its associated control voltage source, which, as illustrated here, is achieved by moving the wiper arm 62 of the potentiometer. When the desired signal is received the switch may be opened and the sweep circuit will immediately lock on the center of that signal. For some applications, for example, a communications receiver or a VHF television receiver, some or all of the control voltage sources may preferably be designed to apply a predetermined voltage to the output 70 when its associated switch is closed.

Once the preset positions of the control voltage sources 52 have been set or adjusted as desired, the receiver may be immediately tuned to any of the preset frequencies or channels by momentarily closing the appropriate switch. The RC time constant of the resistance of the respective potentiometers 52 and the capacitor 76 determines the length of time during which a switch 54 must remain closed. The resistances of the voltage source 52 should preferably be relatively low so that the resulting RC time constants are less than about 0.5 second.

I claim:

1. A preset tuning system, comprising a control voltage source, a search tuning circuit having an input and an output, said search tuning circuit including a ramp generator circuit for generating a predetermined and reoccurring voltage ramp and a frequency locking circuit, tuning means having an input coupled to said search tuning circuit output and an output coupled to said search tuning circuit input; said tuning means being tuned by the amplitude of the voltage on said search tuning circuit output generated by said ramp generator circuit, said frequency locking circuit having means for sensing a signal on said search tuning circuit input, for locking on the center frequency of that signal, and for alternatively inhibiting and initiating operation of said ramp generator in accordance with the center frequency of the sensed signal whereby the tuning of said tuning means is maintained at said center frequency; means for removing the signal on said search tuning circuit input whereby said ramp generator is no longer inhibited; means to temporarily inhibit said search tuning circuit while simultaneously and temporarily coupling said control voltage source to said search tuning circuit output, said tuning means being adjustable by said voltage source to a desired frequency signal while said ramp generator is inhibited, whereby said frequency locking circuit coincidentally detects the center frequency of said desired frequency signal and permits limited operation of said ramp generator when said search tuning circuit is no longer inhibited and said control voltage is no longer coupled thereto, to maintain the tuning of said tuning means at the center frequency of said desired frequency signal.

2. The invention as set forth in claim 1 wherein said control voltage source includes a plurality of potentiometers and wherein said means to temporarily couple said voltage source to said search tuning circuit output includes a plurality of switches corresponding to said plurality of potentiometers.

3. The invention as set forth in claim 1 wherein said means to temporarily inhibit said search tuning circuit comprises means to temporarily apply to said input of said search tuning circuit a voltage sufficient to hold said search tuning circuit in a state of equilibrium.

4. The invention as set forth in clam 1 wherein said voltage source is a variable value voltage divider.

5. The invention as set forth in claim 1 wherein said control voltage source is adapted to apply a predetermined voltage to said output.

* * * * *